United States Patent [19]

Merritt et al.

[11] Patent Number: 5,790,448
[45] Date of Patent: Aug. 4, 1998

[54] ON-CHIP PROGRAM VOLTAGE GENERATOR FOR ANTIFUSE REPAIR

[75] Inventors: Todd A. Merritt; Kevin Duesman, both of Boise, Id.

[73] Assignee: Micron Technology, Inc., Boise, Id.

[21] Appl. No.: 742,809

[22] Filed: Nov. 1, 1996

Related U.S. Application Data

[63] Continuation of Ser. No. 516,005, Aug. 16, 1995, Pat. No. 5,604,693.

[51] Int. Cl.[6] ................................................. G11C 13/00
[52] U.S. Cl. ........................................... 365/96; 365/94
[58] Field of Search ................................ 365/94, 96, 226

[56] References Cited

U.S. PATENT DOCUMENTS 3,091,754  5/1963  Nazare ................................. 365/96
3,245,051  4/1966  Robb .................................... 365/96
5,197,027  3/1993  Challa ................................. 365/185
5,257,225  10/1993  Lee .................................... 365/185

FOREIGN PATENT DOCUMENTS

0485016 A2  5/1992  European Pat. Off. .
0 491490 A2  6/1992  European Pat. Off. .

OTHER PUBLICATIONS

John P. Uyemura, "Fundamentals of MOS Digital Integrated Circuits," Addison–Wesley Publishing Company (1988), p. 586.

Semiconductor Booster Circuit, pp. 1–118. (Taiwanese Patent Application Ser. No. 8410394).

Primary Examiner—Terrell W. Fears
Attorney, Agent, or Firm—Arnold, White & Durkee

[57] ABSTRACT

A memory chip having an on-chip high voltage generator and charge pump.

10 Claims, 2 Drawing Sheets

ON-CHIP PROGRAM VOLTAGE GENERATOR FOR ANTIFUSE REPAIR

This is a continuation of application Ser. No. 08/516,005 filed Aug. 16, 1995 now U.S. Pat No. 5,604,693.

BACKGROUND OF THE INVENTION

1. Field of the Invention

The present invention relates to dynamic random access memory ("DRAM") products, and more particularly, to circuitry for programming antifuse elements in DRAM products.

2. Description of the Prior Art

Contemporary DRAM products require a high degree of redundancy in order to improve manufacturing yields. Present redundancy techniques in DRAMs include providing extra memory array columns and/or extra memory array rows which can be used to replace defective columns and/or rows.

Antifuses have been used as nonvolatile programmable memory elements to store logic states which would be used in DRAMs for row and column redundancy implementation. An antifuse is, by definition, a device which functions as an open circuit until programmed to be a permanent short circuit. Antifuses for redundancy implementation are usually constructed in the same manner as the memory cell capacitors in the DRAM array.

Antifuses have other uses in memory products besides redundancy implementation. Antifuses may, for example, be used in integrated circuit memory as a mechanism for changing the operating mode of the memory. Likewise, antifuses may be programmed to encode identification information about the memory, e.g., when the memory was fabricated.

Antifuse elements in DRAM products have typically been programmed by providing a programming voltage to the memory via an external pin which is higher in magnitude than the normal supply voltage $V_{cc}$ to the memory. Certain problems are, however, created by this approach.

First, the tester that is used to check out the memory product must be capable of providing these higher programming voltages. Second, electrostatic detection (ESD) circuitry on the chip must be modified for the programming voltage, and in doing so, ESD sensitivity may be adversely affected in that the ESD circuits may latch up. The present invention eliminates the need for different ESD structures on a DRAM.

SUMMARY OF THE INVENTION

In accordance with the present invention, a voltage generator is provided in a DRAM to generate the appropriate voltage for programming antifuses. In one embodiment of the present invention, a high voltage charge pump is provided on a DRAM product to generate the high voltage necessary for programming antifuses.

DESCRIPTION OF THE PREFERRED EMBODIMENTS

It will be appreciated that the present invention can take many forms and embodiments. One embodiment of the invention is described so as to give an understanding of the invention. It is not intended that this specific embodiment should in any way limit the true scope of the present invention.

Figure 1:
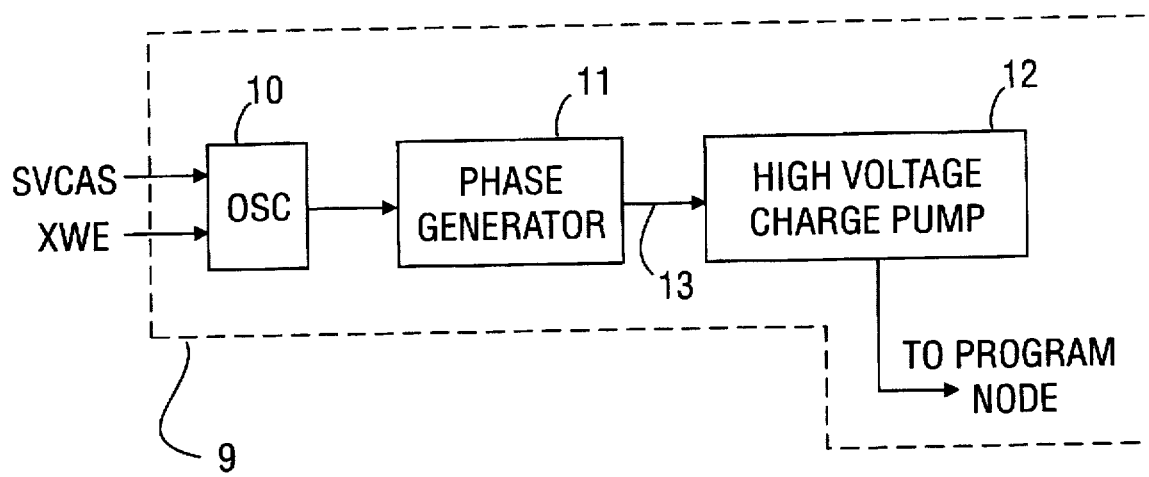
FIG. 1 is an electrical schematic diagram in block diagram form of an on-chip antifuse programmer in accordance with the present invention.

With reference now to FIG. 1, there is shown in block diagram form a DRAM 9 incorporating a preferred embodiment of the present invention. This embodiment includes oscillator 10, phase generator 11 and high voltage charge pump 12. Oscillator 10 is activated by the presence of a super voltage enabling signal on the CAS pin of the DRAM (SVCAS), and by write enable signal (XWE). Upon activation of the signals SVCAS and XWE, oscillator 10 is enabled and produces a clock signal at its output.

Figure 2:
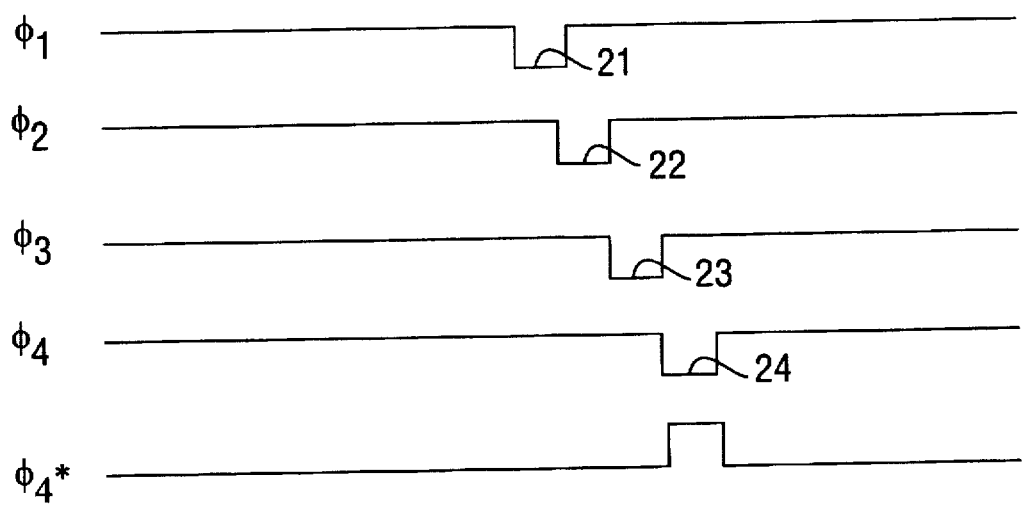
FIG. 2 is a timing diagram which illustrates timing signals that are generated by the phase generator by FIG. 1 and which are used by the charge pump of FIG. 3.

The clock signal at the output of oscillator 10 is coupled to the input of phase generator 11. Phase generator 11 functions to generate timing signals at its output 13 that are used by high voltage charge pump 12. In the preferred embodiment of the present invention phase generator 11 generates the four separate timing signals $\phi_1$–$\phi_4$ that are shown in FIG. 2. The active states of these four timing signals $\phi_1$–$\phi_4$ of FIG. 2 are spaced sequentially in time from one another, and are designated 21, 22, 23 and 24 respectively in FIG. 2. The active state of each timing signals $\phi_1$–$\phi_4$ is preferably about ten nanoseconds in duration. The design of phase generator 11 to produce the four timing signals $\phi_1$–$\phi_4$ is well within the level of skill in the art. For example, phase generator 11 might be implemented using a four-stage shift register counter.

Figure 3:
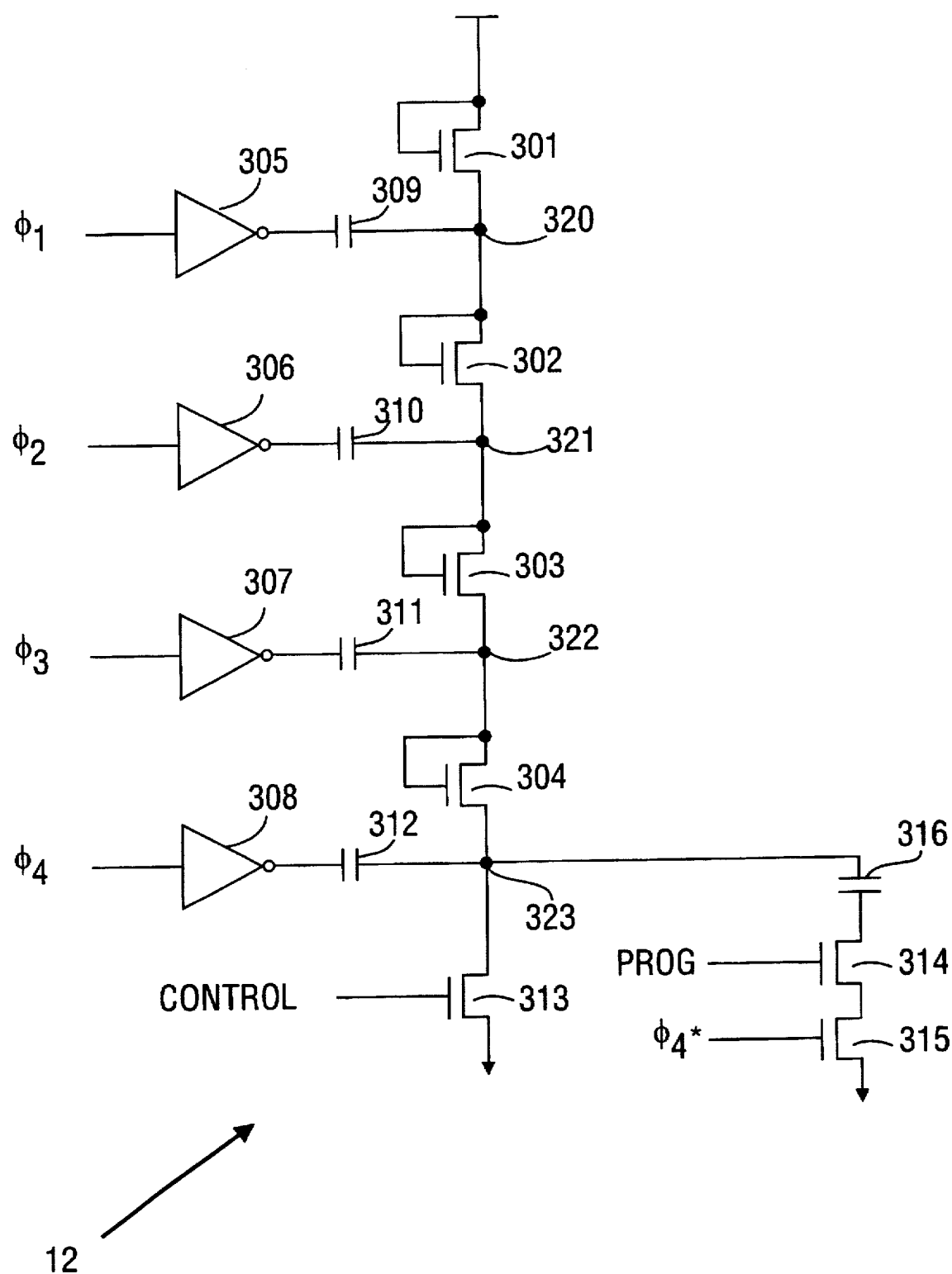
FIG. 3 is an electrical schematic diagram which illustrates one embodiment of the high voltage charge pump of FIG. 1.

With reference to FIG. 3, the four timing signals $\phi_1$, $\phi_2$, $\phi_3$ and $\phi_4$ that are generated by phase generator 11 are provided as inputs to the high voltage charge pump 12. As shown in FIG. 3, a preferred embodiment of high voltage charge pump 12 includes transistors 301–304, which are connected as shown. Each transistor 301–304 has a threshold voltage $V_T$. The preferred embodiment of high voltage charge pump 12 also includes inverters 305–308, capacitors 309–312 and transistors 313–315, all connected as shown. Also shown in FIG. 3 is an antifuse element 316 to be programmed.

The signal CONTROL is connected to the gate of transistor 313. When CONTROL is +5 volts, transistor 313 functions to connect node 323 to ground to prevent the charge pump 12 from generating any programming voltage. Thus, when it is desired to program antifuses, the signal CONTROL must be brought to zero volts to turn off transistor 313, and the program signal PROG must be brought to +5 volts, which turns on transistor 314.

Each of the timing signals $\phi_1$–$\phi_4$ are active when approximately zero volts. Prior to the active state of the first $\phi_1$ pulse to high voltage charge pump 12, the output of inverter 305 is approximately zero volts, the voltages at node 320 and across capacitor 309 are each approximately $V_{cc}$–$V_T$. Upon the occurrence of the first active state of $\phi_1$, the output of inverter 305 rises to a voltage equal to $V_{cc}$. Since the voltage across capacitor 309 remains at $V_{cc}$–$V_T$, the voltage at node 320 rises to a voltage equal to $2V_{cc}$–$V_T$.

After the first $\phi_1$ pulse but before the first $\phi_2$ pulse, the voltages at node 321 and across capacitor 310 are each $2V_{cc}$–$2V_T$. When $\phi_2$ is received, the voltage at node 321 rises to $3V_{cc}$–$2V_T$. This process continues and when timing pulse $\phi_4$ is received the voltage at node 323 is $5V_{cc}-4V_T$, which is sufficient in magnitude to program antifuse element 316.

As phase generator 11 continues to generate the timing signals $\phi_1-\phi_4$, the voltages at the nodes of the high voltage charge pump will stay at the values described above.

The complement of $\phi_4$ is $\phi_4^*$ as shown in FIG. 2. Thus, upon the occurrence of the active state 24 of $\phi_4$, $\phi_4^*$ turns on switch 315, which is preferably a transistor, thereby allowing the programming voltage at node 323 to program antifuse element 316.

While a specific configuration of high voltage charge pump 12 has been described, it will be understood that high voltage charge pump 12 may be implemented using any type of charge pump. For example, high voltage charge pump 12 may be implemented by using either a VCCP charge pump or a charge pump that is used to program memory cells in flash memory devices.

What is claimed is:

1. An integrated circuit chip, comprising:
    at least one one-time programmable element; and
    at least one high voltage on-chip generator, wherein the high voltage on-chip generator produces an on-chip voltage greater than the integrated circuit's supply voltage, and wherein the produced on-chip voltage is operatively coupled to the at least one one-time programmable element.

2. The integrated circuit chip of claim 1, wherein the integrated circuit is a memory device.

3. The integrated circuit chip of claim 2, wherein the memory device is a dynamic random access memory.

4. The integrated circuit chip of claim 1, wherein the one-time programmable element is an antifuse.

5. The integrated circuit chip of claim 1, wherein the high voltage on-chip generator is a charge pump.

6. The integrated circuit chip of claim 5, wherein the charge pump further comprises N transistors in series to produce the on-chip voltage equal to (N+1) times the supply voltage less the sum of the threshold voltages of the N transistor, wherein N is a positive integer.

7. The integrated circuit chip of claim 6, wherein N=4.

8. The integrated circuit chip of claim 1, wherein it further comprises:
    a switch which is enabled to permit the on-chip voltage to program the one-time programmable element.

9. The integrated circuit chip of claim 8, wherein the switch is a transistor.

10. The integrated circuit chip of claim 9, wherein the switch is operatively coupled to the side of the one-time programmable element which is opposite of the side to which the on-chip voltage is coupled.

* * * * *